(12) United States Patent
Uejima et al.

(10) Patent No.: US 8,254,126 B2
(45) Date of Patent: Aug. 28, 2012

(54) ELECTRONIC CIRCUIT DEVICE

(75) Inventors: Naoki Uejima, Nagoya (JP); Hirohisa Suzuki, Nishio (JP); Nobutomo Takagi, Okazaki (JP)

(73) Assignee: Anden Co., Ltd., Anjo (JP)

( * ) Notice: Subject to any disclaimer, the term of this patent is extended or adjusted under 35 U.S.C. 154(b) by 109 days.

(21) Appl. No.: 12/947,209

(22) Filed: Nov. 16, 2010

(65) Prior Publication Data

US 2011/0141701 A1  Jun. 16, 2011

(30) Foreign Application Priority Data

Dec. 14, 2009 (JP) ................................ 2009-282869

(51) Int. Cl.
  *H05K 7/20* (2006.01)
  *F28F 7/00* (2006.01)
  *H01L 23/34* (2006.01)

(52) U.S. Cl. ....... 361/704; 165/80.2; 165/185; 257/719; 361/707; 361/715; 361/719; 361/722; 361/723

(58) Field of Classification Search .................. None
See application file for complete search history.

(56) References Cited

U.S. PATENT DOCUMENTS

| | | | | |
|---|---|---|---|---|
| 4,254,447 A | * | 3/1981 | Griffis ........................... | 361/719 |
| 5,023,752 A | * | 6/1991 | Detter et al. .................. | 361/752 |
| 6,166,909 A | * | 12/2000 | Sumida ........................ | 361/704 |
| 7,599,186 B2 | * | 10/2009 | Gardin .......................... | 361/704 |
| 7,944,681 B2 | * | 5/2011 | Nakanishi et al. ............. | 361/641 |
| 2004/0004818 A1 | * | 1/2004 | Kawakita et al. ............. | 361/704 |
| 2007/0195504 A1 | * | 8/2007 | Tomikawa et al. ............ | 361/715 |
| 2008/0294324 A1 | * | 11/2008 | Yoshinari et al. ............. | 701/102 |
| 2009/0039504 A1 | * | 2/2009 | Kimura et al. ................ | 257/718 |

FOREIGN PATENT DOCUMENTS

| | | |
|---|---|---|
| JP | A-05-067889 | 3/1993 |
| JP | A-2007-329230 | 12/2007 |

* cited by examiner

*Primary Examiner* — Gregory Thompson
(74) *Attorney, Agent, or Firm* — Posz Law Group, PLC

(57) ABSTRACT

An electronic circuit device includes a bus bar, a base component and an electronic component. The bus bar has an external connector terminal capable of receiving electric power from an external power source. The base component has a metallic heat radiation portion and is disposed to oppose the bus bar. The electronic component is held between the bus bar and heat the radiation portion of the base component. The bus bar further includes fixing terminals extending toward the base component. The fixing terminals are fixed to the base component to constitute fixing portions. The fixing portions are configured to have elasticity and exert a restoring force such that a distance between the bus bar and the base component reduces. The electronic component is in pressure contact with the bus bar and the base component by the restoration force of the elasticity of the fixing portions.

6 Claims, 9 Drawing Sheets

ELECTRONIC CIRCUIT DEVICE

CROSS REFERENCE TO RELATED APPLICATION

This application is based on Japanese Patent Application No. 2009-282869 filed on Dec. 14, 2009, the disclosure of which is incorporated herein by reference.

FIELD OF THE INVENTION

The present invention relates to an electronic circuit device in which an electronic component is held between a bus bar and a base component.

BACKGROUND OF THE INVENTION

In an electronic circuit device, measures for radiating heat generated from an electronic component are generally employed. For example, if a heat radiation component for dedicated use of radiating heat is employed, manufacturing costs are likely to increase. To solve such an issue, JP2007-329230A has proposed to bond a power supply bus bar and a surface of an electronic component with a heat conductive adhesive, thereby to radiate heat from the electronic component through the power supply bus bar and further through a power supply lead, which is connected to a connector terminal of the bus bar.

SUMMARY OF THE INVENTION

It is an object of the present invention to provide an electronic circuit device capable of improving heat radiation while reducing manufacturing costs.

According to an aspect of the present invention, an electronic circuit device includes a bus bar, a base component, and an electronic component. The bus bar includes an external connector terminal capable of receiving electric power from an external power source. The base component is disposed to oppose the bus bar. The base component includes a heat radiation portion made of a metallic material.

The bus bar further includes fixing terminals extending toward the base components. The fixing terminals are fixed to the base component to constitute fixing portions. The fixing portions are configured to have elasticity and exert a restoring force such that a distance between the bus bar and the base component reduces. The electronic component is held between the bus bar and the base component and in pressed contact with the bus bar and the base component in accordance with the restoring force of the fixing portions.

Accordingly, the electronic component is fixed by being held between the bus bar and the base component. That is, the electronic component can be fixed without using a heat conductive adhesive. Further, the electronic component is in pressed contact with the bus bar and the base component. Therefore, heat generated from the electronic component is properly transferred to the heat radiation portion of the base component and to the bus bar. The heat transferred to the bus bar can be radiated to the outside through the external connector. Thus, costs for the heat conductive adhesive reduce and heat radiation improve.

BRIEF DESCRIPTION OF THE DRAWINGS

Other objects, features and advantages of the present invention will become more apparent from the following detailed description made with reference to the accompanying drawings, in which like parts are designated by like reference numbers and in which.

DETAILED DESCRIPTION OF EXEMPLARY EMBODIMENTS

Exemplary embodiments of the present invention will be hereinafter described with reference to the drawings. Here, like parts are designated by like reference numbers and a description thereof will not be repeated.

First Embodiment

An electronic circuit device according to the first embodiment has integrated circuits and electromagnetic relays therein and is, for example, used for current control of a vehicle electric device such as a head lamp and a wiper motor.

Figure 1:
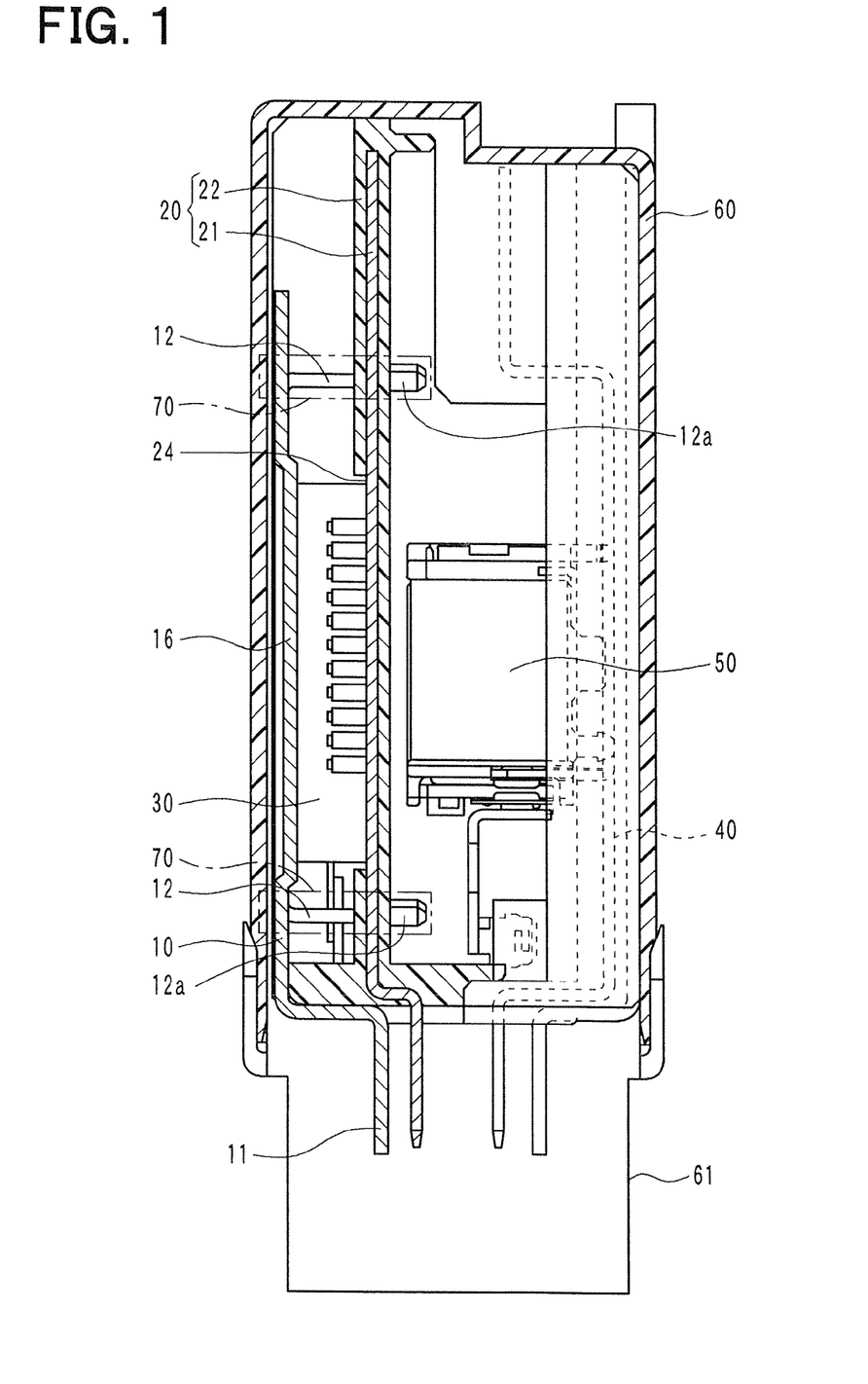
FIG. 1 is a cross-sectional view of an electronic circuit device according to a first embodiment of the present invention.

As shown in FIG. 1, the electronic circuit device has a power supply bus bar 10, a base component 20, an electronic component 30, a relay bus bar 40, a relay 50 and a resin case 60.

Each of the bus bars 10, 40 is a generally plate-shaped wire. For example, the bus bar 10, 40 is punched from a heat conductive metal plate, such as a copper-based metal plate, using a pressing machine.

Figure 2A:
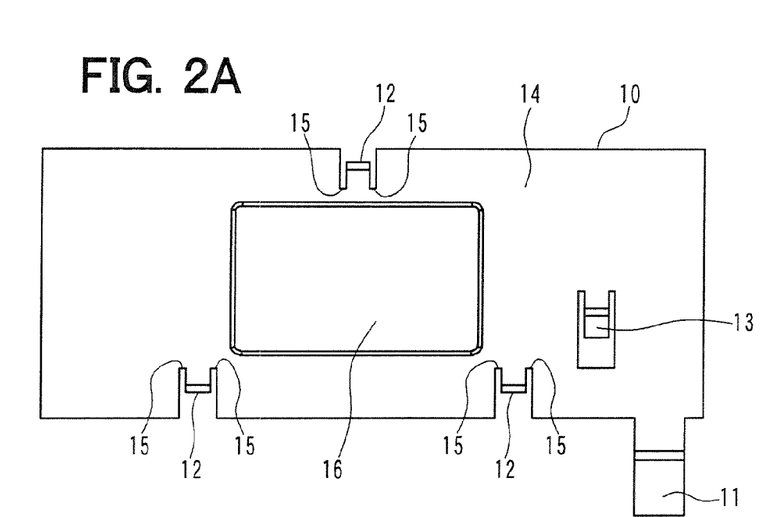
FIG. 2A is a plan view of a power supply bus bar of the electronic circuit device according to the first embodiment.
Figure 2B:
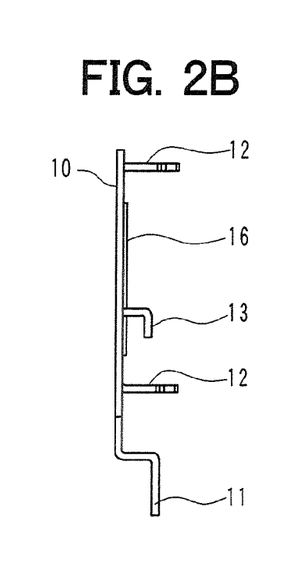
FIG. 2B is a side view of the power supply bus bar when viewed from the right side in FIG. 2A.
Figure 2C:
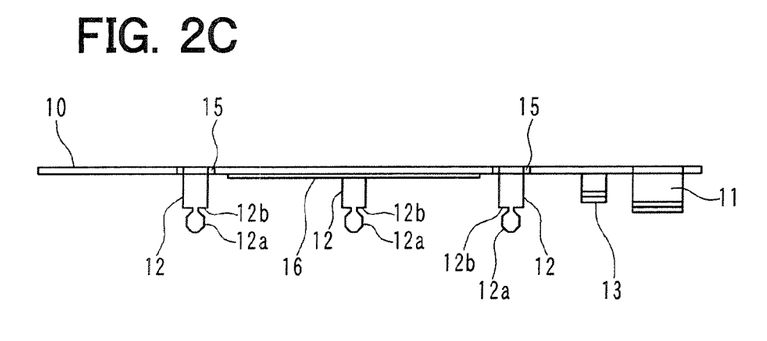
FIG. 2C is a bottom view of the power supply bus bar when viewed from the bottom in FIG. 2A.

As shown in FIGS. 2A through 2C, the bus bar 10 has an external connector terminal 11, three fixing terminals 12 and a supply terminal 13. The external connector terminal 11 is provided to receive electric power from an external power source. The fixing terminals 12 are provided for fixing the bus bar 10 to the base component 20.

As shown in FIG. 2A, the fixing terminals 12 are disposed at three locations on a wall 14 of the bus bar 10. For example, the fixing terminals 12 are located at apexes of a triangle on the wall 14 of the bus bar 10. The supply terminal 13 is provided to supply the electric power to the base component 20.

The terminals 11, 12, 13 are formed by bending portions of the bus bar 10 perpendicularly with respect to the wall 14. For example, as shown in FIG. 1, the fixing terminals 12 are bent toward the base component 20. Similarly, the external connector terminal 11 and the supply terminal 13 are bent toward the base component 20.

The bus bar 10 is formed with slits 15 along longitudinal sides of each terminal 12 so that the terminal 12 is springy or elastic with respect to the wall 14. As such, the terminal 12 is movable in directions perpendicular to the wall 14. For example, the terminal 12 is movable toward the base component 20.

As shown in FIG. 2C, the terminal 12 is formed with a step portion 12b adjacent to an end 12a thereof. Thus, the end 12a of the terminal 12 has a width smaller than a width of a base portion of the terminal 12, the base portion connecting to the wall 14.

Figure 4A:
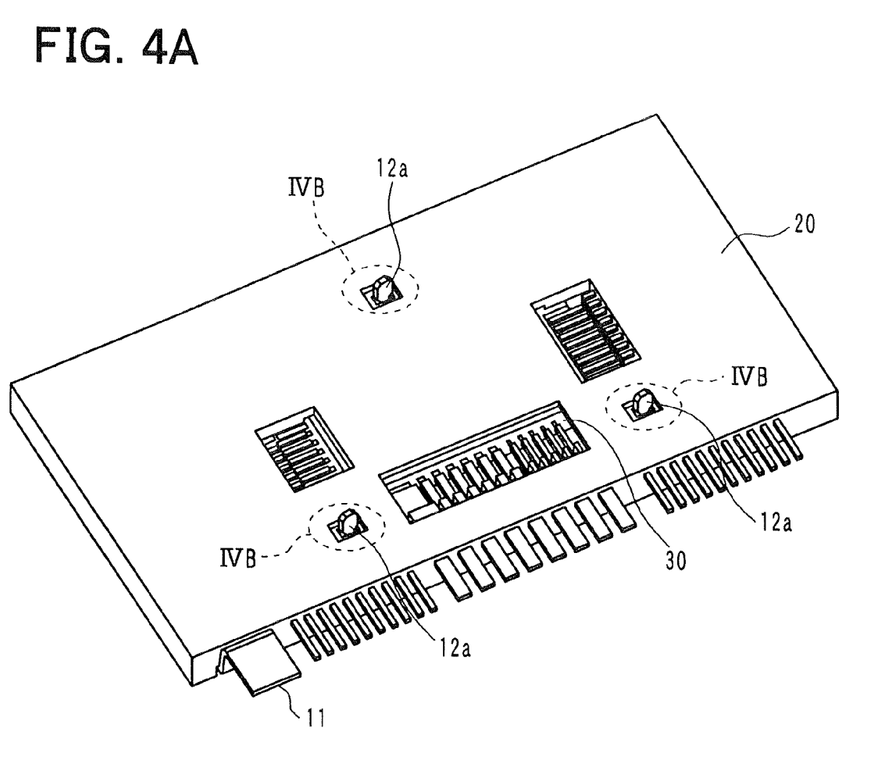
FIG. 4A is a perspective view of the base component holding the electronic component with the power supply bus bar according to the first embodiment.
Figure 4B:
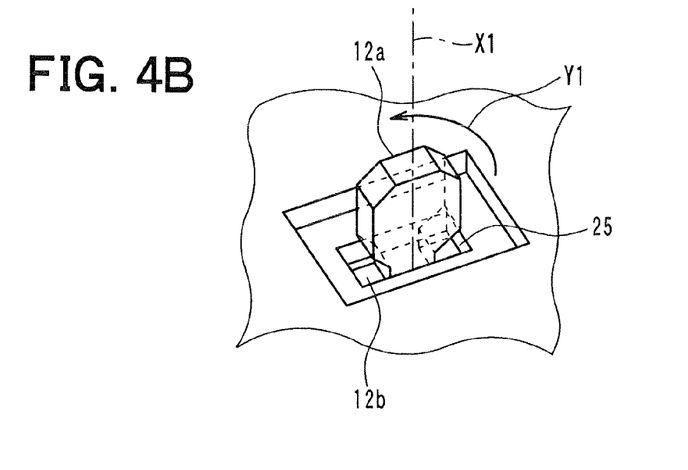
FIG. 4B is an enlarged view of a part IVB in FIG. 4A.

As shown in FIGS. 4A through 4C, the wall 14 has a recess recessing toward the base component 20 at a portion where the electronic component 30 contacts. In other words the portion of the wall 14 projects toward the base component 20 to form the recess on a side opposite to the base component 20. The recess constitutes a springy portion 16.

The base component 20 serves as a wire of the electronic component 30. The base component 20 has a generally plate-like shape. The base component 20 has a lead frame 21 and a molded resin 22. The lead frame 21 has a predetermined shape. For example, the lead frame 21 is punched from a metal plate, such as a copper-based metal plate, by pressing, similar to the bus bar 10.

Figure 3:
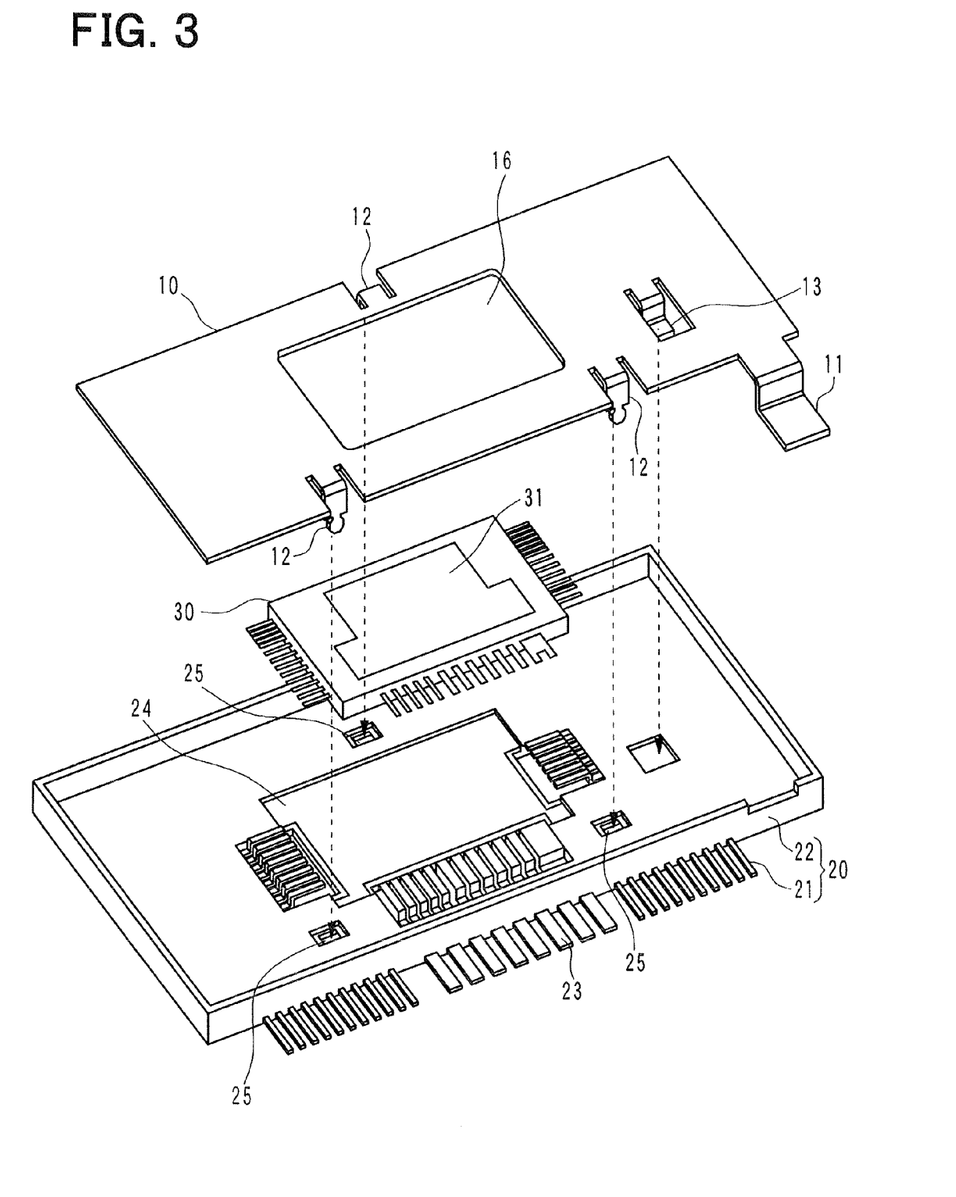
FIG. 3 is an exploded perspective view of the power supply bus bar, an electronic component and a base component of the electronic circuit device according to the first embodiment.

As shown in FIG. 3, the lead frame 21 is molded with the resin 22 such that predetermined portions of the lead frame 21 are exposed from the resin 22, the predetermined portions including terminal portions 23, which serve as terminals of the lead frame 21, a heat radiation portion 24 to be opposed to the electronic component 30, fixing hole portions 25 to be opposed to the fixing terminals 12, and portions to be opposed to the supply terminals 13.

The heat radiation portion 24 is configured to contact the electronic component 30 to radiate heat from the electronic component 30.

The fixing hole portions 25 are disposed at positions opposing to the fixing terminals 12. The fixing hole portions 25 have openings to which the fixing terminals 12 are inserted. The base component 20 having the above-described structure is arranged to oppose the bus bar 10.

The electronic component 30 is a hybrid IC in which multiple MOSFETs and their control circuits are integrated. As shown in FIG. 3, the electronic component 30 has a generally plate-like shape. The electronic component 30 is provided with a heat sink 31 in a wall that faces the bus bar 10. The electronic component 30 is molded with a resin such that the heat sink 31 is exposed.

As shown in FIGS. 1 and 3, the electronic component 30 is held between the bus bar 10 and the heat radiation portion 24 of the base component 20. Hereinafter, a structure of holding the electronic component 30 between the bus bar 10 and the heat radiation portion 24 will be described in detail with reference to FIGS. 4A, 4B and 5.

Figure 5:
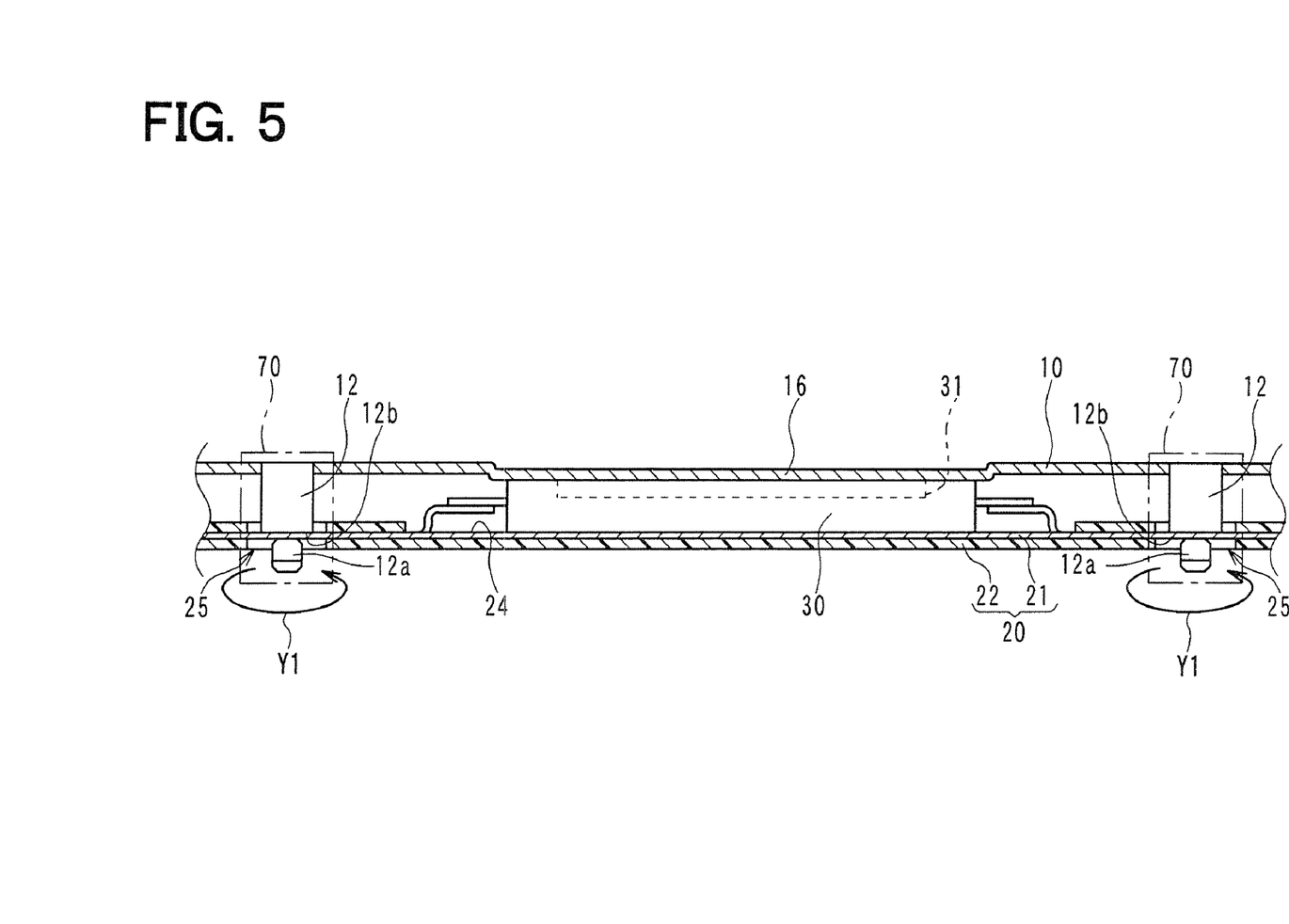
FIG. 5 is a cross-sectional view of a part of the structure shown in FIG. 4A.

FIG. 4A is a perspective view of the structure when viewed from a side of the base component 20. FIG. 5 is a cross-sectional view of a part of the structure shown in FIG. 4A when taken along a line passing through two fixing terminals 12, which are adjacent to a longitudinal side of the base component 20 from which the external connector terminal 11 extends.

To hold the electronic component 30 between the bus bar 10 and the base component 20, first, the terminals 12 are inserted to the openings of the fixing hole portions 25 so that the step portions 12b are engaged with the lead frame 21 and the ends 12a project from the lead frame 21. At this time, the heat sink 31 directly contacts the springy portion 16 as well as the heat radiation portion 24. Further, the ends 12a are fixed to the base component 20, as shown in FIG. 4A.

Specifically, each of the ends 12a, which projects from the lead frame 21 through the opening of the fixing hole portion 25, is twisted about a longitudinal axis X1 of the fixing terminal 12, as shown by an arrow Y1 in FIG. 4B. Thus, the fixing terminals 12 are fixed to the base component 20. The fixing terminals 12 fixed to the base component 20 constitute fixing portions 70, as shown in FIG. 5. The fixing portions 70 are springy or elastic by means of the slits 15.

As such, when the ends 12a of the fixing terminals 12 are fixed to the fixing hole portions 25 by twisting, the restoring force of elasticity of the fixing portions 70 is exerted such that a distance between the base component 20 and the bus bar 10 is reduced. Therefore, the electronic component 30 is directly in pressed contact with the bus bar 10 and the heat radiation portion 24. Accordingly, the bus bar 10, the base component 20 and the electronic component 30 are integrated into a unit while holding the electronic component 30 between the bus bar 10 and the base component 20.

In such a case where the fixing terminals 12 are fixed to the base component 20 by twisting the ends 12a, a fixing force of the fixing terminals 12 is adjustable in accordance with a degree of twisting, such as an angle of twisting. Further, the electronic component 30 is pressed against the bus bar 10 in accordance with the elasticity of the springy portion 16, which is in contact with the electronic component 30. As such, the electronic component 30 closely contacts the bus bar 10 and the heat radiation portion 24 of the base component 20.

Since the fixing terminals 12 are arranged at the apexes of a triangle, it is less likely that the bus bar 10 and the base component 20 will be separated from the electronic component 30 when the ends 12a are fixed by twisting. In other words, the electronic component 30 is held between the bus bar 10 and the base component 20 while maintaining flatness of the bus bar 10. As such, the electronic component 30 properly contacts the bus bar 10 and the heat radiation portion 24. In a case where the fixing terminals 12 are positioned on the apexes of an equilateral triangle, the flatness of the bus bar 10 improves.

The relay bus bar 40 serves as a wire to mount the relay 50 thereon. The relay 50 is arranged opposite to the electronic component 30 with respect to the base component 20. That is, the relay 50 is mounted on the bus bar 40, and is located between the base component 20 and the bus bar 40.

The case 60 provides an external of the electronic circuit device, and accommodates the power source bus bar 10, the base component 20, the electronic component 30, the relay bus bar 40 and the relay 50 therein. The case 60 includes a connector portion 61 to which a non-illustrated wiring connector is connected. The external connector terminal 11, the lead frame 21 and the like are located in the connector portion 61.

Figure 6:
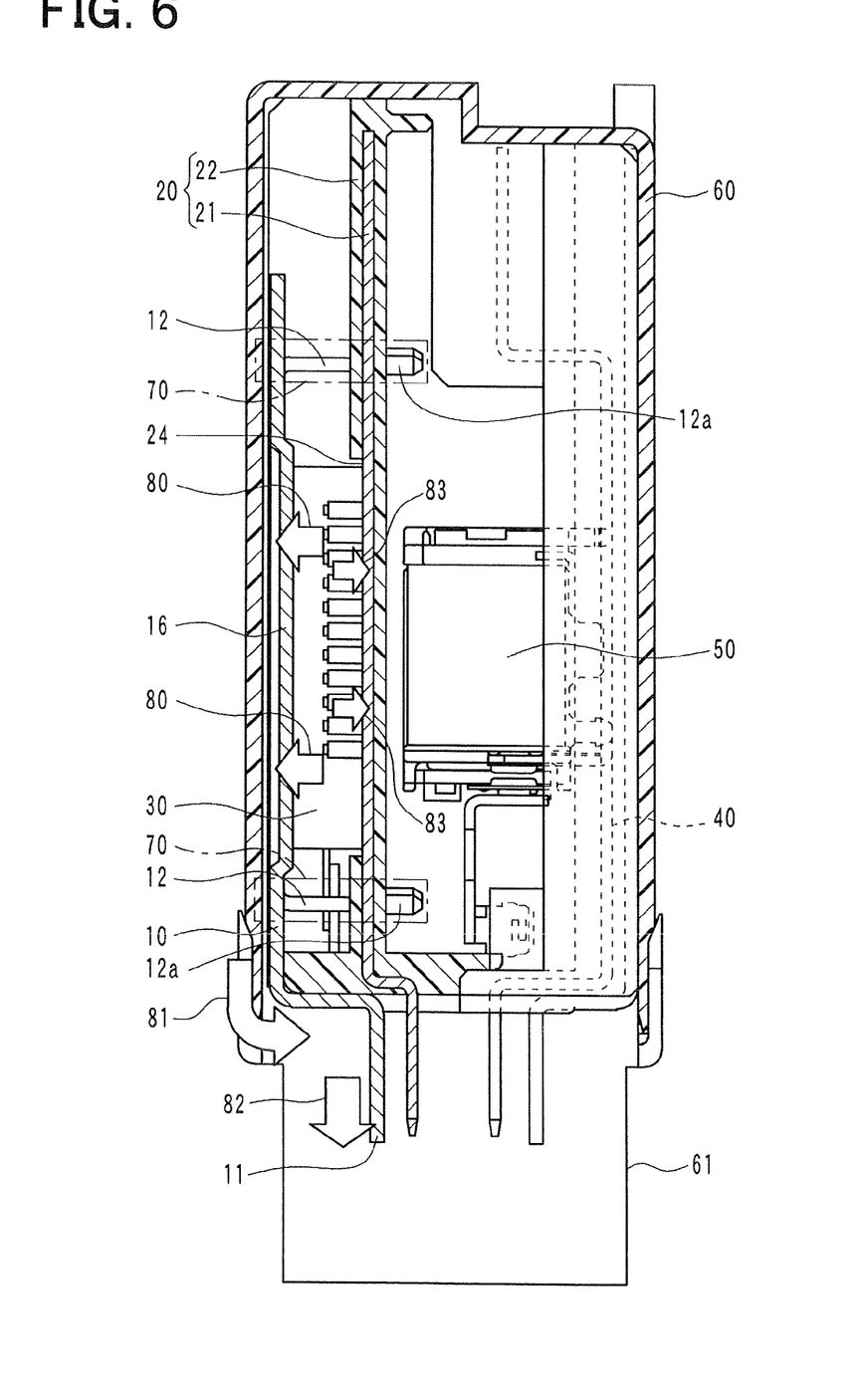
FIG. 6 is a cross-sectional view of the electronic circuit device for explaining radiation paths of heat from the electronic component according to the first embodiment.

Next, radiation paths of heat generated from the electronic component 30 in the electronic circuit device will be described with reference to FIG. 6. In FIG. 6, the radiation paths are shown by arrows 80 through 83.

Heat generated from the electronic component 30 is transferred to the bus bar 10, which is directly in contact with the heat sink 31, as shown by the arrows 80. The heat moves within the bus bar 10, as shown by the arrow 81. Also, the heat is radiated to the outside of the electronic circuit device from a non-illustrated power supply wire connected to the external connector terminal 11 via the external connector terminal 11, as shown by the arrow 82.

The electronic component 30 is in direct contact with the bus bar 10 as well as the heat radiation portion 24 of the base component 20. Therefore, the heat generated from the electronic component 30 is transferred also to the heat radiation portion 24, as shown by the arrows 83.

Namely, since the electronic component 30 is held between the bus bar 10 and the heat radiation portion 24, the heat from the electronic component 30 can be transferred not only to the bus bar 10 but also to the base component 20.

As described in the above, the fixing terminals 12 are fixed to the base component 20 to form the fixing portions 70, and the fixing portions 70 are configured to have elasticity. The electronic component 30 is held between the bus bar 10 and the base component 20, which are fixed at the elastic fixing portions 70.

That is, the electronic component 30 is fixed by being held between the bus bar 10 and the base component 20 and is in direct contact with the bus bar 10 and the base component 20. In such a structure, a heat conductive adhesive for bonding the electronic component 30 and the bus bar 10 is not necessary.

The electronic component 30 is mechanically brought into close contact with the bus bar 10 and the base component 20 as the ends 12a are twisted to fix the fixing terminals 12 to the lead frame 21. Therefore, costs for the heat conductive adhesive are saved. In addition, the fixing terminals 12 are fixed to the lead frame 21 by twisting the ends 12a thereof. In other words, portions of the bus bar 10 are used as fixing means. Therefore, the number of fixing parts is not increased.

The electronic component 30 is in pressure contact with the bus bar 10 and the base component 20, and thus contact of the electronic component 30 with the bus bar 10 and the base component 20 is stable. Therefore, the heat of the electronic component 30 is properly radiated to the power supply wire, which is connected to the external connector terminal 11, via the external connector terminal 11. Also, the heat from the electronic component 30 is properly radiated to the base component 20. Accordingly, heat radiation of the electronic circuit device improves.

Second Embodiment

Figure 7:
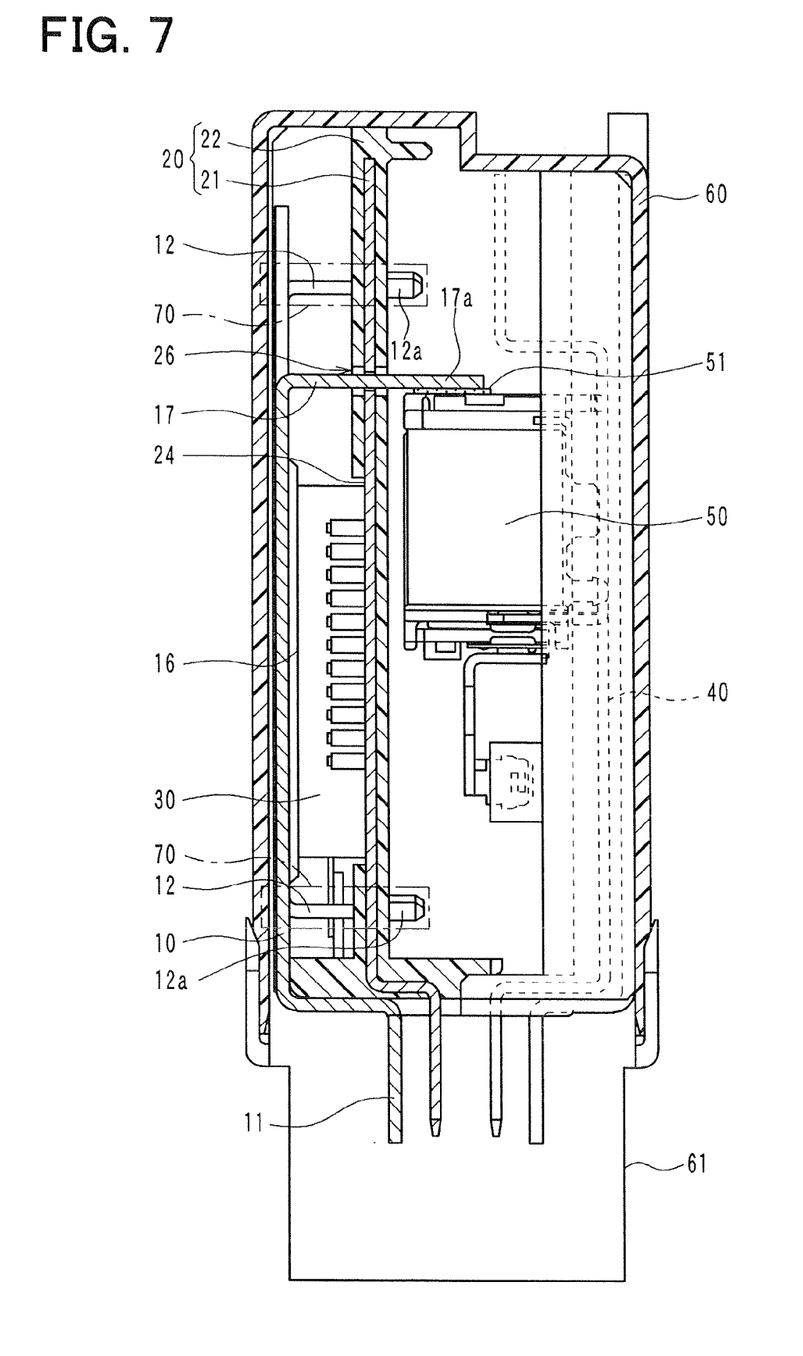
FIG. 7 is a cross-sectional view of an electronic circuit device according to a second embodiment of the present invention.

In a second embodiment of the present invention, the bus bar 10 further has a heat radiation terminal 17, as shown in FIG. 7. The heat radiation terminal 17 is formed by bending a portion of the bus bar 10 toward the base component 20. The end 17a of the heat radiation terminal 17 is located opposite to the electronic component 30 with respect to the base component 20.

The base component 20 is formed with a through hole portion 26 having a through hole for allowing the heat radiation terminal 17 to pass through. For example, a portion of the lead frame 21, which corresponds to the heat radiation terminal 17, is exposed from the resin 22, and the through hole is formed in the exposed portion of the lead frame 21.

When the electronic component 30 is arranged between the bus bar 10 and the base component 20, the heat radiation terminal 17 passes through the through hole portion 26 and the end 17a of the heat radiation terminal 17 is positioned between the base component 20 and the relay bus bar 40.

Further, the relay 50 is provided with an insulated heat radiation sheet 51 on a side surface facing the heat radiation terminal 17. The insulated heat radiation sheet 51 is, for example, made of a resin. As shown in FIG. 7, the end 17a of the heat radiation terminal 17 is in direct contact with the insulated heat radiation sheet 51. As such, the end 17a of the heat radiation terminal 17 is thermally connected to the relay 50 through the heat radiation sheet 51, although the heat radiation terminal 17 is electrically insulated from the relay 50.

Figure 8:
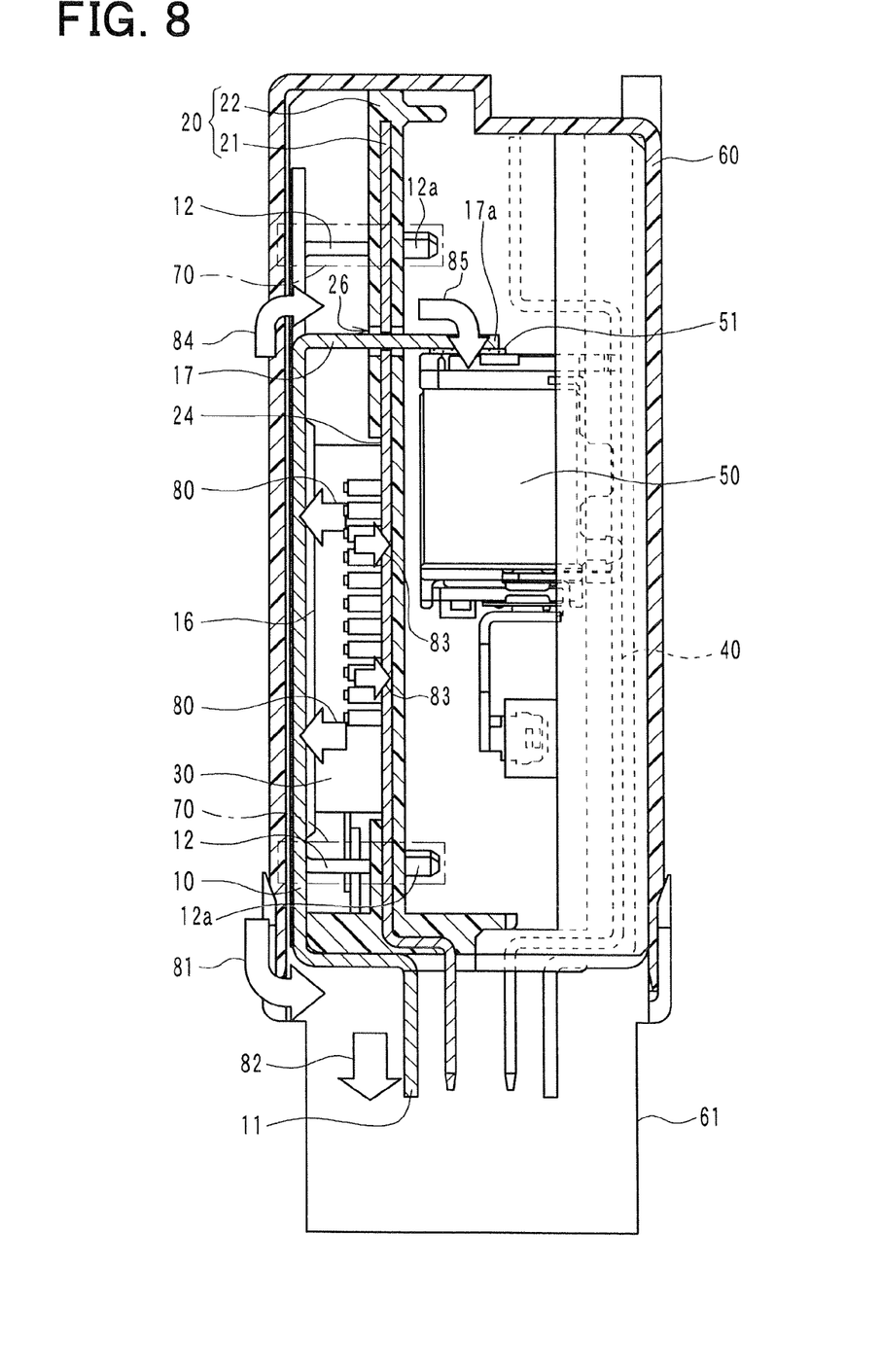
FIG. 8 is a cross-sectional view of the electronic circuit device for explaining radiation paths of heat from an electronic component according to the second embodiment.

Next, heat radiation paths of the second embodiment will be described with reference to FIG. 8. Similar to the first embodiment, heat generated from the electronic component 30 is transferred to the bus bar 10 and radiated from the power supply wire via the external connector terminal 11. Also, the heat is radiated to the heat radiation portion 24 of the base component 20.

Further, in the bus bar 10, the heat from the electronic component 30 is transferred to the heat radiation terminal 17 through the wall 14, as shown by an arrow 84. The heat is then radiated to the relay 50 through the end 17a and the heat radiation sheet 51, as shown by an arrow 85. In this structure, the heat is radiated to the relay 50, in addition to the heat radiation paths through the external connector terminal 11 and the base component 20. Accordingly, heat radiation further improves.

Third Embodiment

In the first and second embodiments, the bus bar 10 is formed with the slits 15 and the fixing terminals 12 are movable in directions perpendicular to the wall 14 of the bus bar 10. That is, the fixing terminals 12 have elasticity and thus the fixing portions 70 have elasticity. In the third embodiment, on the other hand, the elasticity of the fixing portions 70 is achieved by elasticity of the base component 20.

Figure 9:
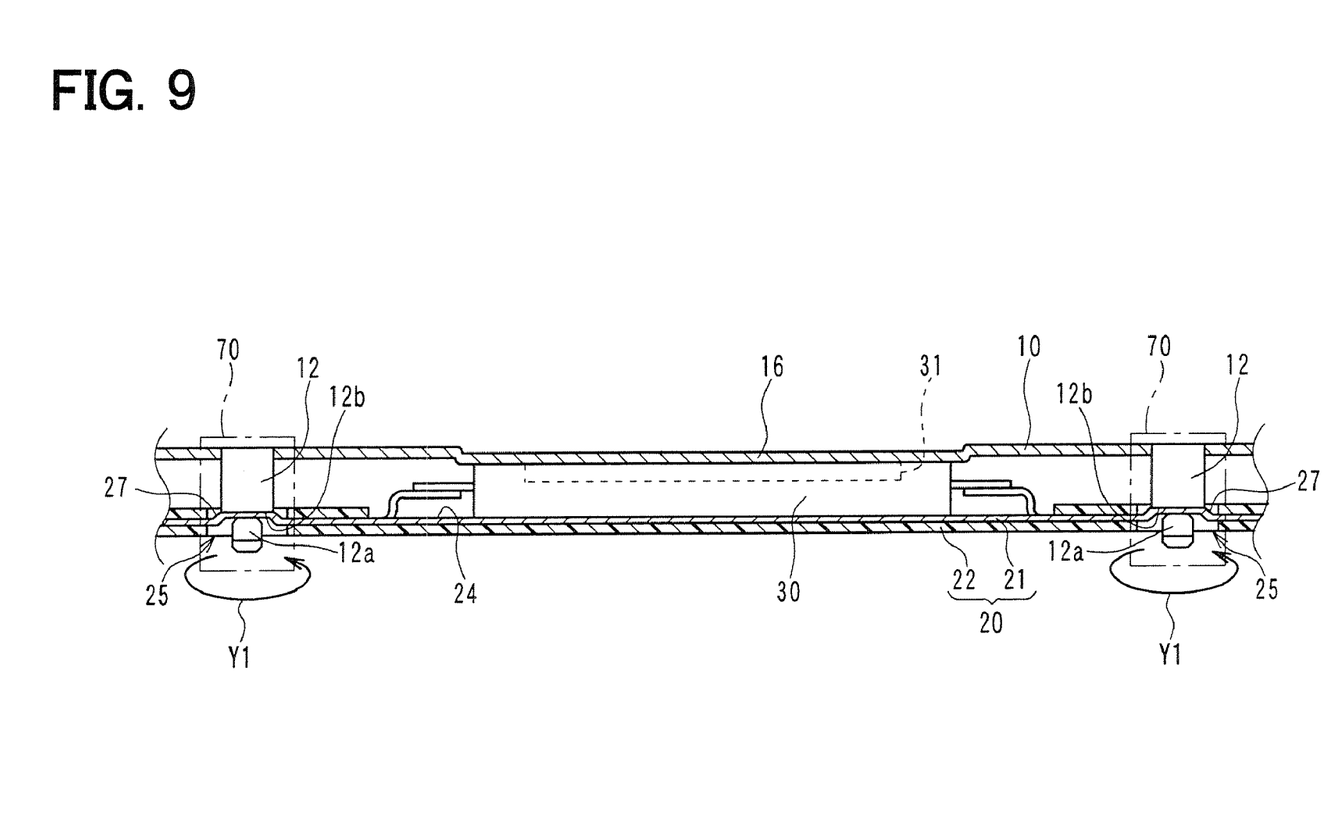
FIG. 9 is a schematic cross-sectional view of a structure to hole an electronic component between a bus bar and a base component according to a third embodiment of the present invention.

FIG. 9 shows a cross-section of a part of a structure to holed the electronic component 30 between the bus bar 10 and the base component 20. As shown in FIG. 9, the base component 20 has springy portions 27. Each of the springy portions 27 is provided by a recess formed at a portion corresponding to the fixing hole portion 25 and recessed toward the bus bar 10 from a side facing the relay 50. The springy portion 27 is springy or elastic, and is movable in directions perpendicular to a plane surface of the lead frame 21, that is, directions parallel to a direction in which the bus bar 10 and the base component 20 are layered.

Specifically, when the end 12a of the fixing terminal 12 is twisted in a condition where the step portion 12b of the fixing terminal 12 is pressed against the springy portion 27, the springy portion 27 is deformed toward the bus bar 10. As such, the restoring force of the springy portion 27 is exerted such that a distance between the base component 20 and the bus bar 10 reduces. Therefore, the electronic component 30 is in pressed contact with the bus bar 10 and the heat radiation portion 24.

As described above, the elasticity of the fixing portions 70 can be achieved by the springy portions 27 of the lead frame 21. In this case, in addition to the springy portions 27 of the lead frame 21, the bus bar 10 can have the slits 15 to make the fixing terminals 12 elastic, similar to the first embodiment.

Other Embodiments

In the above-described embodiments, the contact between the electronic component 30 and the bus bar 10 is improved by the springy portion 16 of the bus bar 10. However, it is not always necessary to form the springy portion 16 in the bus bar 10. In the case where the springy portion 16 is formed in the bus bar 10, the contact between the bus bar 10 and the electronic component 30 is properly maintained by the elasticity of the springy portion 16 even if the restoring force of the fixing portions 70 is reduced due to aging degradation of the bus bar 10 and the base component 20.

In the above-described embodiments, the fixing terminal 12 are fixed to the lead frame 21 by twisting the ends 12a about the longitudinal axis X1 to form the fixing portions 70. However, such a fixing method is an example, and the fixing portions 70 can be configured in different ways. For example, the fixing terminals 12 can be fixed to the lead frame 21 by bending the ends 12a toward the lead frame 21, instead of the twisting. As another example, the fixing terminals 12 can be fixed to the lead frame 21 by screwing. As further another example, the ends 12a can be thermally fixed to the lead frame 21. Furthermore, the ends 12a can be fitted to the lead frame 21.

In the above-described embodiments, the bus bar 10 and the base component 20 are fixed to each other by the three fixing portions 70. However, the number of the fixing portions 70 is not limited to three. For example, the bus bar 10 and the base component 20 can be fixed to each other by at least two fixing portions 70. The bus bar 10 and the base component 20 can be fixed to each other by four or more fixing portions 70.

In the above-described embodiments, the structure of the base component 20 in which the lead frame 21 is molded with the resin 22 is an example. The base component 20 can be constructed in any other ways. For example, the base component 20 can be constructed of only the lead frame 21.

In the above-described embodiments, the heat generated from the electronic component 30 is transferred to the bus bar 10 and is then released to the power supply wire through the external connector terminal 11. In addition to this structure, the bus bar 10 can be arranged such that the wall 14 contacts an inner surface of the case 60 so that the heat can be also radiated to the case 60. In such a case, the bus bar 10 can be arranged such that the wall 14 closely contacts the inner surface of the case 60 to further improve heat radiation.

Additional advantages and modifications will readily occur to those skilled in the art. The invention in its broader term is therefore not limited to the specific details, representative apparatus, and illustrative examples shown and described.

What is claimed is:

1. An electronic circuit device comprising:
   a bus bar including an external connector terminal capable of receiving electric power from an external power source;
   a base component disposed to oppose the bus bar, the base component including a metallic heat radiation portion; and
   an electronic component held between the bus bar and the heat radiation portion of the base component, wherein
   the bus bar further includes fixing terminals extending toward the base component,
   the fixing terminals are fixed to the base component to constitute fixing portions,
   the fixing portions are configured to have elasticity and exert a restoring force such that a distance between the bus bar and the base component reduces, and
   the electronic component is in pressed contact with the bus bar and the base component in accordance with the restoring force of the fixing portions.

2. The electronic circuit device according to claim 1, further comprising:
   a relay disposed opposite to the electronic component with respect to the base component; and
   an insulated heat radiation sheet disposed on the relay, wherein
   the base component has a through hole portion defining a through hole,
   the bus bar further includes a heat radiation terminal extending toward the base component,
   the heat radiation terminal passes through the through hole of the base component, and an end of the heat radiation terminal is disposed opposite to the electronic component with respect to the base component, and
   the end of the heat radiation terminal is thermally connected to the relay through the insulated heat radiation sheet.

3. The electronic circuit device according to claim 1, wherein
   the fixing terminals are disposed at three locations, which are on the apexes of a triangle.

4. The electronic circuit device according to claim 1, wherein
   the base component has fixing hole portions defining openings,
   the fixing terminals pass through the openings of the fixing hole portions, and ends of the fixing terminals are deformed by being twisted about longitudinal axes of the fixing terminals, thereby fixing the fixing terminals to the base component.

5. The electronic circuit device according to claim 1, wherein
   the bus bar further includes a springy portion, and
   the springy portion is provided by a recess that is formed at a portion of the bus bar and recessed toward the base component, the portion contacting the electronic component.

6. The electronic circuit device according to claim 1, wherein
   the elasticity of the fixing portions is provided by at least one of slits and springy portions, the slits being formed in a wall of the bus bar from which the fixing terminals extend, the springy portions being formed in the base component at positions adjacent to the fixing portions as recesses recessing toward the bus bar.

* * * * *